(12) United States Patent
Tabery et al.

(10) Patent No.: US 7,657,864 B2
(45) Date of Patent: Feb. 2, 2010

(54) SYSTEM AND METHOD FOR INTEGRATED CIRCUIT DEVICE DESIGN AND MANUFACTURE USING OPTICAL RULE CHECKING TO SCREEN RESOLUTION ENHANCEMENT TECHNIQUES

(75) Inventors: Cyrus E. Tabery, Santa Clara, CA (US); Todd P. Lukanc, San Jose, CA (US); Chris Haidinyak, Santa Cruz, CA (US); Luigi Capodieci, Santa Cruz, CA (US); Carl P. Babcock, Campbell, CA (US); Hung-eil Kim, San Jose, CA (US); Christopher A. Spence, Sunnyvale, CA (US)

(73) Assignee: Globalfoundries Inc., Grand Cayman (KY)

( * ) Notice: Subject to any disclaimer, the term of this patent is extended or adjusted under 35 U.S.C. 154(b) by 100 days.

(21) Appl. No.: 11/741,845

(22) Filed: Apr. 30, 2007

(65) Prior Publication Data

US 2007/0209030 A1 Sep. 6, 2007

Related U.S. Application Data

(62) Division of application No. 10/816,764, filed on Apr. 2, 2004, now Pat. No. 7,269,804.

(51) Int. Cl.
*G06F 17/50* (2006.01)

(52) U.S. Cl. .............. 716/21; 716/19; 716/20; 382/144; 430/5; 703/13

(58) Field of Classification Search ............ 716/19–21; 382/144; 430/5; 703/13
See application file for complete search history.

(56) References Cited

U.S. PATENT DOCUMENTS

| | | | |
|---|---|---|---|
| 5,707,765 A * | 1/1998 | Chen | 430/5 |
| 6,399,260 B1 | 6/2002 | Kikuchi | |
| 6,415,421 B2 | 7/2002 | Anderson et al. | |
| 6,425,113 B1 | 7/2002 | Anderson et al. | |
| 6,433,878 B1 * | 8/2002 | Niu et al. | 356/603 |
| 6,453,457 B1 * | 9/2002 | Pierrat et al. | 716/19 |
| 6,510,730 B1 | 1/2003 | Phan et al. | |
| 6,523,162 B1 | 2/2003 | Agrawal et al. | |
| 6,578,188 B1 * | 6/2003 | Pang et al. | 716/19 |
| 6,704,921 B2 * | 3/2004 | Liu | 716/19 |
| 6,757,645 B2 * | 6/2004 | Chang et al. | 703/13 |
| 6,779,159 B2 * | 8/2004 | Yokoyama et al. | 716/4 |

(Continued)

OTHER PUBLICATIONS

International Search Report and Written Opinion for International Application No. PCT/US2005/007301 dated Mar. 1, 2006.

*Primary Examiner*—Naum B Levin
(74) *Attorney, Agent, or Firm*—Ditthavong, Mori & Steiner, P.C.

(57) ABSTRACT

A method of selecting a plurality of lithography process parameters for patterning a layout on a wafer includes simulating how the layout will print on the wafer for a plurality of resolution enhancement techniques (RETs), where each RET corresponds to a plurality of lithography process parameters. For each RET, the edges of structures within the simulated layout can be classified based on manufacturability. RETs that provide optimal manufacturability can be selected. In this manner, the simulation tool can be used to determine the optimal combination of scanner setup and reticle type for minimizing the variation in wafer critical dimension (CD).

15 Claims, 4 Drawing Sheets

U.S. PATENT DOCUMENTS

| | | | |
|---|---|---|---|
| 6,873,720 B2 * | 3/2005 | Cai et al. | 382/149 |
| 6,978,438 B1 * | 12/2005 | Capodieci | 716/21 |
| 7,043,071 B2 * | 5/2006 | Qian et al. | 382/144 |
| 7,073,163 B2 * | 7/2006 | Kashimoto et al. | 716/21 |
| 7,093,228 B2 * | 8/2006 | Andreev et al. | 716/21 |
| 7,093,229 B2 * | 8/2006 | Pang et al. | 716/21 |
| 7,155,689 B2 * | 12/2006 | Pierrat et al. | 716/4 |
| 7,174,520 B2 * | 2/2007 | White et al. | 716/4 |
| 7,194,725 B1 * | 3/2007 | Lukanc et al. | 716/19 |
| 7,254,251 B2 * | 8/2007 | Cai et al. | 382/100 |
| 7,313,769 B1 * | 12/2007 | Lukanc et al. | 716/2 |
| 7,332,359 B2 * | 2/2008 | Hamamatsu et al. | 438/14 |
| 2002/0122994 A1 | 9/2002 | Cote et al. | |
| 2003/0126581 A1 | 7/2003 | Pang et al. | |
| 2003/0154460 A1 | 8/2003 | Taoka et al. | |
| 2003/0236653 A1 | 12/2003 | Zinn | |
| 2004/0063000 A1 | 4/2004 | Maurer et al. | |
| 2004/0091142 A1 | 5/2004 | Peterson et al. | |
| 2004/0147121 A1 * | 7/2004 | Nakagaki et al. | 438/689 |
| 2005/0071659 A1 | 3/2005 | Ferguson et al. | |
| 2005/0188338 A1 | 8/2005 | Kroyan et al. | |
| 2005/0223350 A1 | 10/2005 | Zhang et al. | |

* cited by examiner

SYSTEM AND METHOD FOR INTEGRATED CIRCUIT DEVICE DESIGN AND MANUFACTURE USING OPTICAL RULE CHECKING TO SCREEN RESOLUTION ENHANCEMENT TECHNIQUES

CROSS REFERENCE TO RELATED APPLICATIONS

The present application is a divisional application of U.S. patent application Ser. No. 10/816,764, now issued as U.S. Pat. No. 7,269,804, entitled "System and Method for Integrated Circuit Device Design and Manufacture Using Optical Rule Checking to Screen Resolution Enhancement Techniques," filed Apr. 2, 2004, which is incorporated by reference herein. The present application claims priority benefits to U.S. patent application Ser. No. 10/816,764, now issued as U.S. Pat. No. 7,269,804, under 35 U.S.C. §121.

TECHNICAL FIELD

The present invention relates generally to the field of integrated circuit device design and manufacture and, more particularly, to a system and method for integrated circuit design and manufacture using simulations and optical rule checking to screen mask design and resolution enhancement techniques.

BACKGROUND

In designing an integrated circuit (IC) device, engineers or designers typically rely on computer design tools to help create an IC schematic or design, which can include a multitude of individual devices, such as transistors, coupled together to perform a certain function. To actually fabricate the IC device in or on a semiconductor substrate, the IC device schematic must be translated into a physical representation or layout, which itself can then be transferred onto a semiconductor substrate. Computer aided design (CAD) tools, can be used to assist layout designers with translating the discrete circuit elements into shapes, which will embody the devices themselves in the completed IC device. These shapes make up the individual components of the circuit, such as gate electrodes, diffusion regions, metal interconnects and the like.

The software programs employed by the CAD systems to produce layout representations are typically structured to function under a set of predetermined design rules in order to produce a functional circuit. Often, the design rules are determined by certain processing and design limitations based roughly on the patternability of layout designs. For example, design rules may define the space tolerance between devices or interconnect lines.

Once the layout of the circuit has been created, the next step to manufacturing the IC device is to transfer the layout onto a semiconductor substrate. Optical lithography or photolithography is a well-known process for transferring geometric shapes onto the surface on a semiconductor wafer. The photolithography process generally begins with the formation of a photoresist layer on the top surface of a semiconductor substrate or wafer. A reticle or mask having fully light non-transmissive opaque regions, which are often formed of chrome, and fully light transmissive clear regions, which are often formed of quartz, is then positioned over the photoresist coated wafer.

The mask is placed between a radiation or light source, which can produce light of a pre-selected wavelength (e.g., ultraviolet light) and geometry, and an optical lens system, which may form part of a stepper apparatus. When the light from the light source is directed onto the mask, the light is focused to generate a reduced mask image on the wafer, typically using the optical lens system, which may contain one or several lenses, filters, and/or mirrors. This light passes through the clear regions of the mask to expose the underlying photoresist layer, and is blocked by the opaque regions of the mask, leaving that underlying portion of the photoresist layer unexposed. The exposed photoresist layer is then developed, typically through chemical removal of the exposed or unexposed regions of the photoresist layer. The end result is a semiconductor wafer coated with a photoresist layer exhibiting a desired pattern, which defines the geometries, features, lines and shapes of that layer. This pattern can then be used for etching underlying regions of the wafer.

There is a pervasive trend in the art of IC design and fabrication to increase the density with which various structures are arranged and manufactured. For example, minimum line widths (often referred to as critical dimension (CD)), separations between lines, and pitch are becoming increasingly smaller. As the scale of designs and CDs continue to decrease, resolution enhancement techniques (RET) have been employed in lithographic processing in order to achieve sub-wavelength imaging. However, each specific RET has its own advantages and limitations. Depending upon the specific RET used, a given set of features within a layout can have its resolution improved or degraded. It is up to the lithographer and/or designer to determine an optimal combination. This is difficult, because of the interaction between various RETs, and time-consuming using conventional techniques. Typically, the illuminator/numerical aperture (NA)/reticle parameter space is not fully explored, which can affect overall manufacturability. This problem is magnified by the use of aggressive RET strategies, such as dipole illumination, quadrupole illumination, and alternating phase shift masks (PSM), which can result in higher layout-RET interaction.

Accordingly, a need exists in the art for an improved system and method for IC device design and manufacture.

SUMMARY OF THE INVENTION

According to one aspect of the invention, the invention is directed to a method of manufacturing an integrated circuit (IC) device having a given layout. The method can include simulating how structures within the layout will pattern on a wafer for a plurality of resolution enhancement techniques (RETs). Structures within each simulation can be evaluated based on manufacturability and one or more RETs, which provide optimal manufacturability, can be selected.

According to another aspect of the invention, the invention is directed to a method that finds applicability in conjunction with a photolithography processing system, having an associated numerical aperture (NA) value, in which a reticle having a set of reticle parameters is exposed to an illuminator having a set of illuminator parameters to pattern a wafer with a desired layout. The method can include simulating how the desired layout will pattern on a wafer for a plurality of combinations of different NA values, illuminator parameters and reticle parameters. For each combination of NA values, illuminator parameters and reticle parameters, structures within the associated simulated layouts can be classified based on manufacturability. At least one combination of NA value, illuminator parameters and reticle parameters can be selected based on the classifying step.

According to another aspect of the invention, the invention is directed to a method of minimizing wafer critical dimension (CD) variation in an integrated circuit (IC) device wafer patterned with a desired layout. The method can include simulating how the desired layout will print on the wafer for a plurality of RET process windows, where each RET process window corresponds to a plurality of lithography process parameters. For each RET process window, edges of structures within the simulated layout can be classified based on manufacturability and one or more RET process windows, which provide optimal manufacturability, can be selected.

These and other features of the invention are fully described and particularly pointed out in the claims. The following description and annexed drawings set forth in detail certain illustrative embodiments of the invention, these embodiments being indicative of but a few of the various ways in which the principles of the invention may be employed.

BRIEF DESCRIPTION OF DRAWINGS

These and further features of the present invention will be apparent with reference to the following description and drawings, wherein.

DISCLOSURE OF INVENTION

Figure 1:
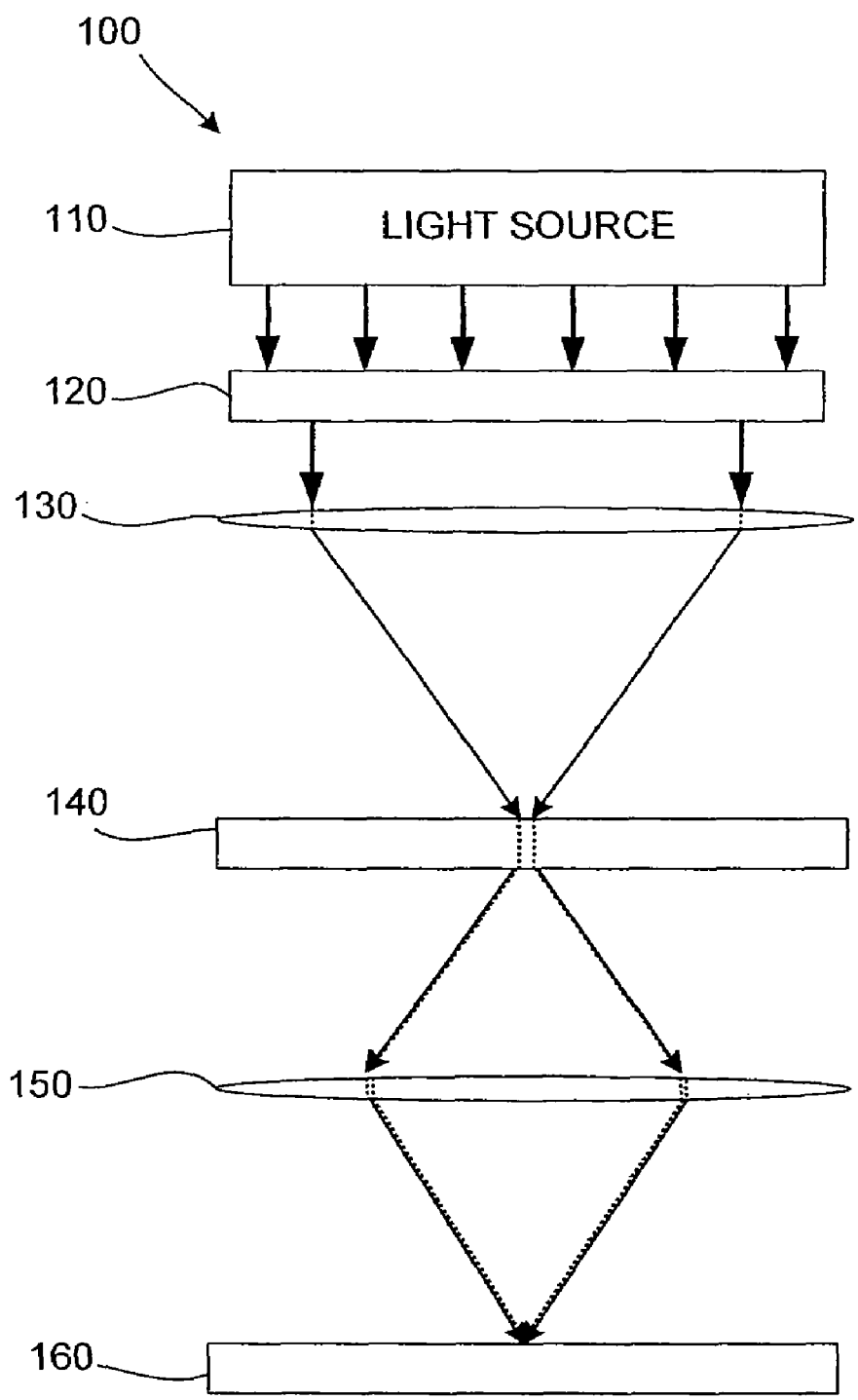
FIG. 1 is a schematic diagram of an exemplary photolithographic apparatus for use with the present invention.

In the detailed description that follows, corresponding components have been given the same reference numerals regardless of whether they are shown in different embodiments of the present invention. To illustrate the present invention in a clear and concise manner, the drawings may not necessarily be to scale and certain features may be shown in somewhat schematic form.

One aspect of the present invention is directed to a method of selecting a plurality of lithography process parameters for patterning a layout on a wafer using a lithography simulation tool. After a desired layout is selected or otherwise provided, a simulation tool can be used to simulate how the layout will print on a wafer for a plurality of resolution enhancement techniques (RETs), where each RET corresponds to a plurality of lithography process parameters. For each RET, the edges of structures within the simulated layout can be classified based on manufacturability. From this, the RET that provides the best manufacturability can be selected. In this manner, the simulation tool can be used to determine the optimal combination of lithography process parameters (e.g., scanner setup and reticle type) for minimizing the variation in wafer critical dimension (CD).

The present invention will be described herein in the exemplary context of a design, layout generation and manufacturing process for ultimately patterning a semiconductor layer (e.g., polysilicon) that forms a part of an IC device. Exemplary IC devices can include general use processors made from thousands or millions of transistors, a flash memory array, SRAM (static random-access memory) cells or any other dedicated circuitry. However, one skilled in the art will appreciate that the methods and systems described herein can also be applied to the design process and/or manufacture of any article manufactured using photolithography, such as micromachines, disk drive heads, gene chips, microelectromechnical systems (MEMS) and the like.

With reference to FIG. 1, an exemplary photolithography apparatus 100 (sometimes referred to as a scanner) for manufacturing or otherwise processing integrated circuit (IC) devices is provided. The photolithography apparatus 100 can include a light source 110, which illuminates an aperture plate 120. The light source 110 can include any suitable light source, such as an excimer laser, providing light at a wavelength of 248 nm, 193 nm or 157 nm, using, for example, an KrF source, a ArF source, a $F_2$ source, etc. The light source can produce light having a wavelength in the ultraviolet (UV) vacuum ultraviolet (VUV), deep ultraviolet (DUV) or extreme ultraviolet (EUV) range. In one embodiment, the aperture plate 120 can include any aperture geometry that provides off-axis illumination, including, but not limited to dipole illumination, quadrupole illumination, double-dipole illumination and annular illumination. Alternatively, another off-axis illumination generating means, such as a suitable diffractive optical element, can be employed.

Light or other actinic energy passing through the aperture plate 120 can be condensed or otherwise focused by a lens system 130 onto a mask or reticle 140 having a desired layout pattern thereon. In one embodiment, the mask 140 can include a transmissive binary mask having a chrome pattern etched on a quartz substrate. However, it is to be appreciated that other masks, such as reflective masks, phase-shifting masks, attenuated or otherwise, and the like, can be employed in order to provide off-axis illumination. At least the $0^{th}$ and $1^{st}$ order diffraction components of the light past by the mask 140 can be focused by a lens system 150 onto a target, such as a photoresist-coated substrate or wafer. As is described more fully below, a photolithography apparatus that provides off-axis illumination includes a number of illumination parameters, which affect the patterning of a layout on a wafer.

Figure 2:
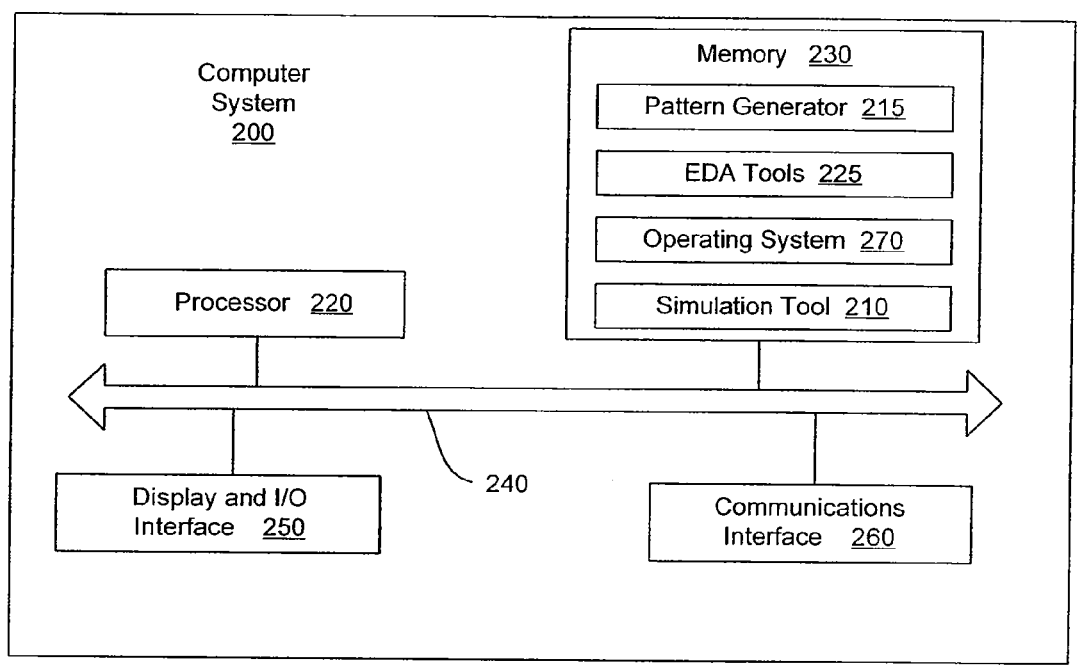
FIG. 2 is a schematic block diagram of a computer system capable of executing a simulation tool in accordance with the present invention.

Turning now to FIG. 2, a schematic block diagram of a computer system 200 capable of executing a lithography simulation tool 210, a layout test pattern generator 215, and other design processes using electronic design automation (EDA) tools 225 in accordance with the present invention is illustrated. As indicated, the simulation tool 210 can be used to generate a simulation image and identify portions of a layout including structures exhibiting or otherwise demonstrating poor manufacturability. In one embodiment, the simulation tool 210 is embodied as a computer program (e.g., a software application including a compilation of executable code). As described more fully below, the layout test pattern generator 215 can be used to generate a plurality of parametrically varying layout test patterns.

To execute the simulation tool 210 and/or the layout test pattern generator 215, the computer system 200 can include one or more processors 220 used to execute instructions that carry out a specified logic routine. In addition, the computer system 200 can include a memory 230 for storing data, software, logic routine instructions, computer programs, files, operating system instructions, and the like. The memory 230 can comprise several devices and includes, for example, volatile and non-volatile memory components. As used herein, the memory 230 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 220 and the memory 230 are coupled using a local interface 240. The local interface 240 can be, for example, a data bus, accompanying control bus, a network, or other subsystem.

The computer system 200 can include various video and input/output interfaces 250 as well as one or more communications interfaces 260. The interfaces 250 can be used to couple the computer system 200 to various peripherals and networked devices, such as a display (e.g., a CRT display or LCD display), a keyboard, a mouse, a microphone, a camera, a scanner, a printer, a speaker, and so forth. The communications interfaces 260 can be comprised of, for example, a modem and/or network interface card, and can enable the computer system 200 to send and receive data signals, voice signals, video signals, and the like via an external network, such as the Internet, a wide area network (WAN), a local area network (LAN), direct data link, or similar wired or wireless system.

The memory 230 can store an operating system 270 that is executed by the processor 220 to control the allocation and usage of resources in the computer system 200. Specifically, the operating system 270 controls the allocation and usage of the memory 230, the processing time of a processor 220 dedicated to various applications being executed by the processor 220, and the peripheral devices, as well as performing other functionality. In this manner, the operating system 270 serves as the foundation on which applications, such as the simulation tool 210, depend as is generally known by those of ordinary skill in the art.

Figure 3:
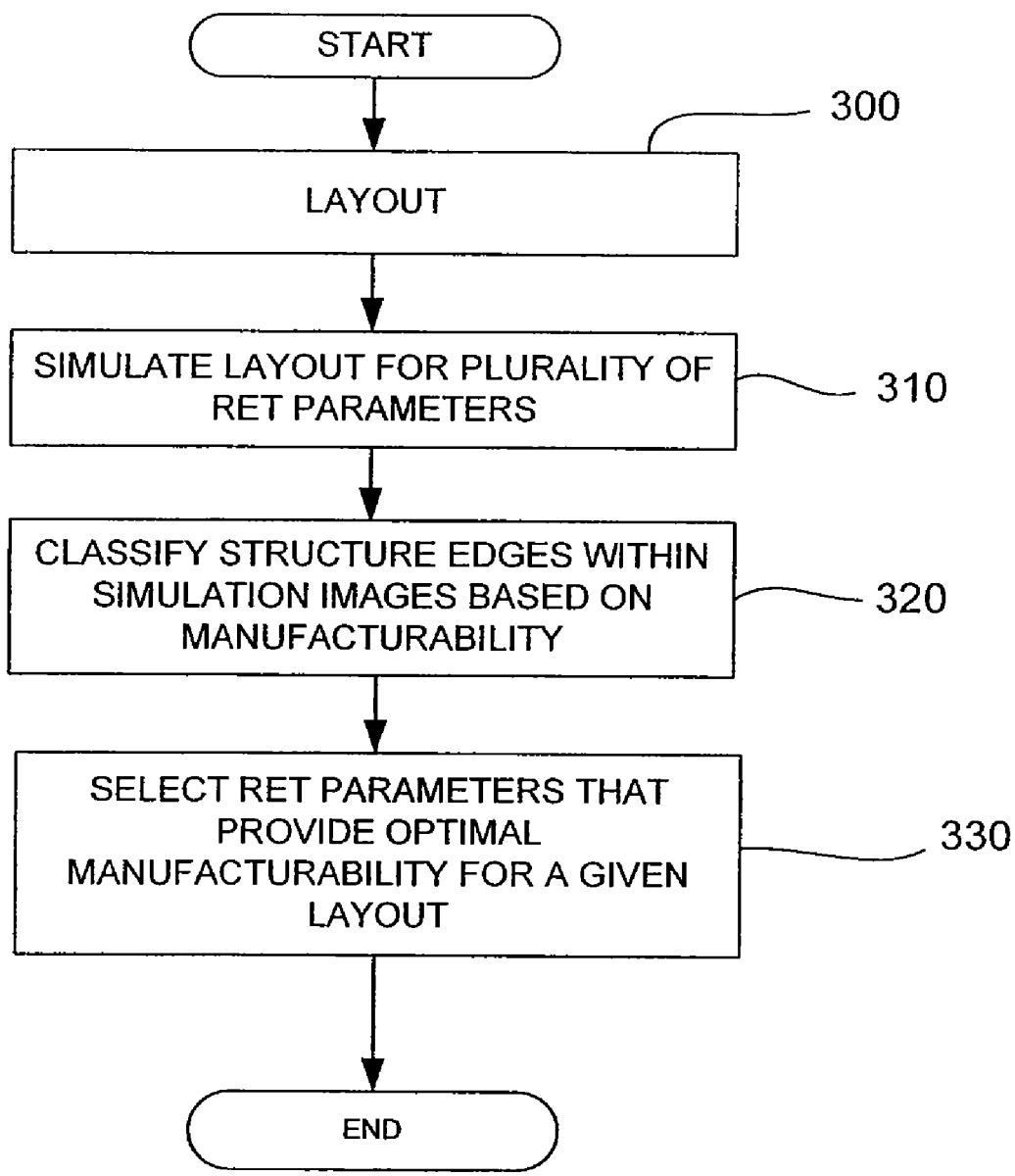
FIG. 3 is a flow chart illustrating a method of selecting a plurality of lithography process parameters for patterning a layout on a wafer in accordance with the present invention.

With reference now to FIG. 3, one embodiment of a method of selecting a plurality of lithography process parameters for patterning an integrated circuit (IC) device layout on a wafer is provided. The flow chart of FIG. 3 can be thought of as depicting steps of a method implemented on or with the assistance of the computer system 200 of FIG. 2.

At step 300, a desired IC device layout is provided. It is to be appreciated that the device layout can represent a conversion or translation of a corresponding IC device design or schematic into a physical representation. The layout can define specific dimensions of gates, isolation regions, interconnects, contacts and other device elements that form physical structures within the device design. These can be represented by a variety of shapes, polygonal, curvilinear and the like.

In one embodiment, the device layout can be generated or otherwise produced in accordance or compliance with a predetermined set of design rules. The predetermined design rules can be determined based on certain processing and/or design limitations, based roughly on the patternability of layout designs. For example, the design rules can define the space tolerance between adjacent structures or devices, interconnect lines and the like.

The layout can be embodied in a layout data file or data set (also referred to as a target database). The layout data file can include data layers that correspond to the actual layers to be fabricated in the IC device. The layout data file can also include cells, which define sets of particular devices within the circuit or IC device design. A cell can include all of the shapes on all of the layers required for the fabrication of the devices it contains. It is to be appreciated that cells can be nested or otherwise contained within other cells, often in vary intricate arrangements. The structure of cells is commonly referred to as a data hierarchy. Typical formats for the shapes of a layout data file or target database include GDS II or CIF.

It is to be appreciated that the desired layout can include product layouts within an existing design library, known problem cells (e.g., bitcells) and/or generic patterns, such as parametrically varying patterns populated by test structures that explore shape and interfeature distance space. For additional discussion of parametrically varying patterns populated by test structures, attention is directed to co-owned U.S. patent application Ser. No. 10/817,132, filed Apr. 2, 2004, titled "SYSTEM AND METHOD FOR DESIGN RULE CREATION AND SELECTION," which is now assigned U.S. Pat. No. 7,194,725, the disclosure of which is incorporated herein by reference in its entirety.

At step 310, the layout can be simulated for a plurality of resolution enhancement techniques (RETS) (also referred to as being simulated over a process space). It is to be appreciated that, as used herein, a RET can include one or more lithography process parameters. These lithography process parameters can include illuminator parameters, numerical aperture (NA) and mask type and mask transmission parameters. Simulating the layout for a particular combination of lithography process parameters or RET can include producing or otherwise generating a simulation image, which corresponds to a simulation of an image that would be printed on a wafer if the wafer was exposed to an illumination source (having the chosen illuminator parameters and NA) directed through a mask (having the selected mask type and mask transmission parameters) including a reticle layout corresponding to the desired layout. Alternatively, the simulation image can correspond to a simulation of a photoresist layer that would be patterned according to exposure to an illumination source (having the selected illuminator parameters and NA) directed through a mask (having the selected mask type and mask transmission parameters) including a reticle layout corresponding to the desired layout.

As such, the real pattern of structures within the layout can be simulated as a result of one or more RETs, optical proximity corrections (OPC), proximity to other structures, density of structures, corner rounding, as well as any other parameters that can alter the final image (i.e., the wafer image) as compared to the drawn or desired layout. In one embodiment, OPC techniques can be applied to the reticle layout data files prior to simulation. Artisans will appreciate that OPC can include the adding of dark regions to and/or the subtracting of dark regions from portions of a reticle to mitigate the distorting effects of diffraction in scattering. In addition, the wafer image can also be evaluated with respect to exposure variations, focus variations, reticle variations and/or other process variations that may alter or otherwise shift the edge placement of structures within the layout with respect to the "target image." In other words, the simulations can be performed for a certain window of variation with respect to one or more of focus, exposure and reticle variations, which can be associated with a particular photolithography apparatus or system.

In one embodiment, the layout can be simulated for a plurality of RETs (i.e., over a given process space) using the same simulation engine or tool as is used to perform OPC and mask data preparation. Using the same simulation engine for simulating different RETs and performing OPC and/or mask data preparation allows for relatively easy automation of the entire simulation process, thereby increasing overall efficiency.

The layout can be simulated using one of a variety of commercially available simulation tools, such as, for example, CALIBRE® from Mentor Graphics Corp. Such simulation tools are useful for simulating or otherwise predicting how structures within the layout, corresponding to the device design, will actually pattern and/or what manufacturing defects may occur during lithographic processing.

It is to be appreciated that the illuminator parameters or settings that can be varied and simulated include, but are not limited to, illuminator source shape (e.g., annular source shape, dipole source shape, quadrupole source shape), orientation of the poles (e.g., horizontal, vertical or some angle between horizontal and vertical), inner radius, $\sigma_{in}$, outer radius, $\sigma_{out}$, and pole angle (also referred to as wedge angle). Further, mask or reticle parameters that can be varied include mask type (e.g., binary, phase shift mask (PSM), attenuated PSM) and mask transmission. It is to be appreciated that inner radius, $\sigma_{in}$, can represent the most normal angle of illumination incident on the reticle, while outer radius, $\sigma_{out}$, can represent the least normal angle of illumination incident on the reticle.

At step 320, edges of structures within each simulation image (step 310), where each simulation image corresponds to a simulation of a layout or target database for a given RET or combination of lithography process parameters, can be classified or otherwise evaluated based on manufacturability. In other words, each simulation image can be examined to determine whether it includes areas, regions or features (e.g., structure edges), which demonstrate or are otherwise indicative of poor or acceptable manufacturability for a given RET. In one embodiment, all structure edges within the layout can be classified or otherwise evaluated based on manufacturability for a given RET.

Regions, features or edges demonstrating or exhibiting poor manufacturability can be determined or otherwise identified by applying one or more optical rule checking (ORC) checks. ORC can be performed based on one or more process-related parameters, also referred to as metrics. These process-related metrics can be indicative of the manufacturability of a layout or a portion thereof for a given set of lithography parameters or a given RET. In one embodiment, optical rule checking can be performed based on, but not limited to, aerial image metrics, such as contrast, image log slope, image slope, minimum intensity, maximum intensity, and/or intensity at a distance (e.g., 0-1000 nm). Alternatively, simulators may also simulate final resist or etched images and base manufacturability on at least one of resist height, sidewall angle, and edge placement. Latent image metrics may also be employed, such as photo active compound (PAC) or photoacid (PA) gradient, maximum PAC concentration, and minimum PAC concentration. In addition, post exposure bake metrics of image transfer quality may also be used, including, deprotected sites, such as gradients or minimum/maximum values or values at edges.

At step 330, the RETs or combinations of lithography parameters, which provide optimal manufacturability for a given layout or target database, can be selected or otherwise identified based on the classification and/or evaluation of edges or other features within the simulation images for each RET combination. In one embodiment, selecting or otherwise identifying optimal combinations of lithography parameters (i.e., selecting an optimal process space) can include selecting the RET or process space that results in minimized wafer CD variation (i.e., selecting the RET or process space that minimizes sensitivity to variations in focus, exposure and the reticle). In one embodiment, this can be quantified or otherwise determined by calculating the percentage of optically different edges that have, for example, an image log slope that is greater than a first predetermined value and no "critical edges" having an image log slope that is less than a second predetermined value. It is to be appreciated that each edge must be patterned within some specification to result in a functional and high performance device. So called "critical edges" are edges that must be controlled the tightest for this high yield state to exist. Typically, critical edges are edges with minimum design rules. For example, a critical polysilicon edge may exist where it defines part of a minimum gate. Field polysilicon may also be critical if it has a minimum spacing to an unrelated contact. Through simulation, it can be determined whether a given edge meets the CD control requirements for yield.

Alternatively, one or more of the aforementioned metrics of quality can be determined for various process parameters and compared in order to determine optimal process parameters. In another alternative embodiment, for a given set of process parameters, all features that change CD by more than a predetermined amount for a given focus, exposure or reticle variation, can be identified.

In one embodiment, one or more graphical representations can be generated or otherwise provided in connection with classifying or evaluating, based on manufacturability, edges of structures within the simulation images for each combination of process parameters. Each graphical representation can illustrate portions of process space (made up of lithography process parameters, such as NA, illuminator parameters and reticle or mask parameters) based on manufacturability. The graphical representations can include, but are not limited to, graphical maps, histograms, response curves and the like. Alternatively, a value, series of values and/or composite value can be exported or otherwise provided in a data table, where each cell in the table represents a portion of the process space. This alternative embodiment can be thought of as a numerical equivalent to the graphical representation described more fully below. In this alternative embodiment, the data table can be searched for edges having an image slope of greater than some predetermined value or on the basis of some other metric of manufacturability.

Figure 4:
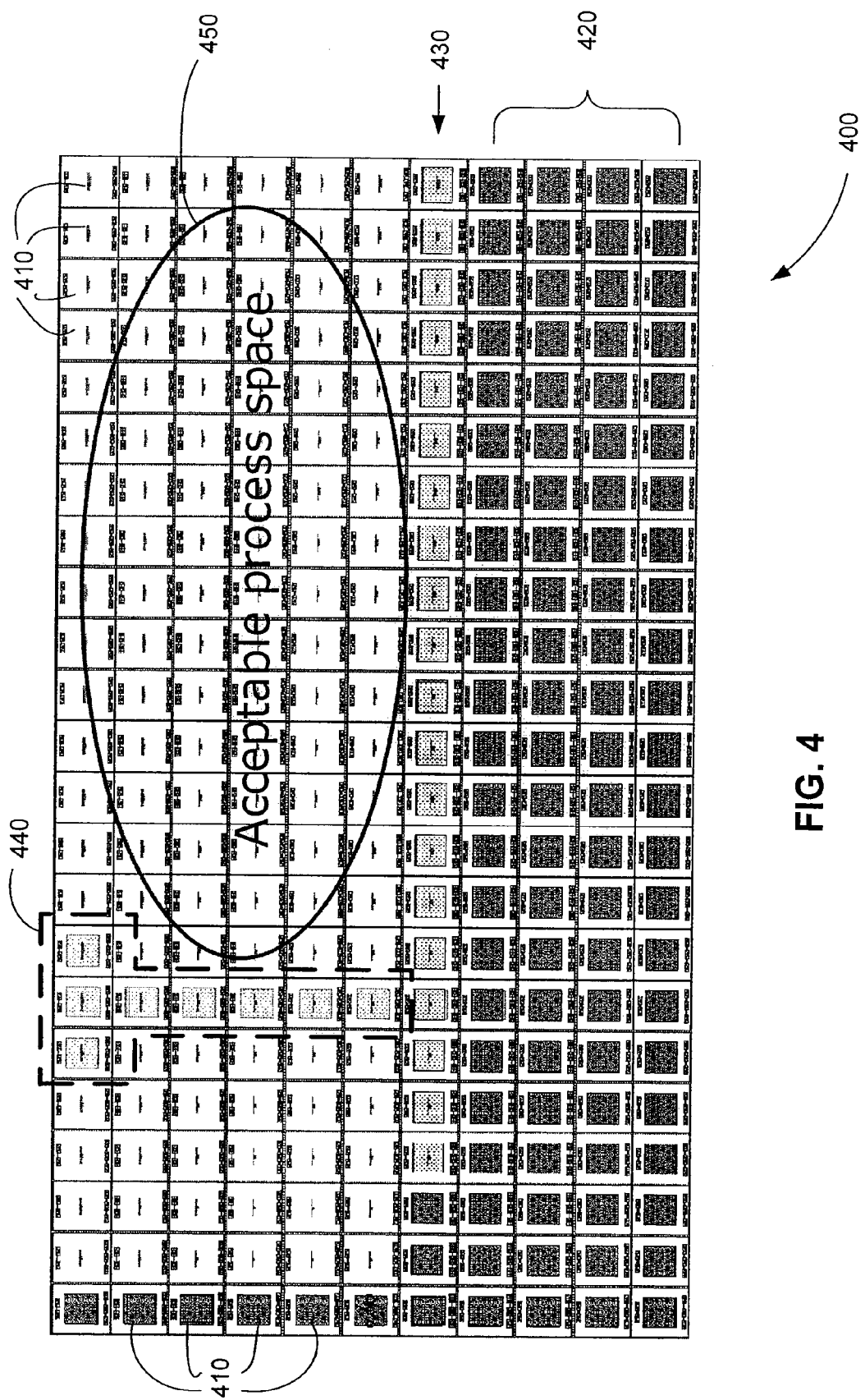
FIG. 4 is an exemplary graphical representation, which can be indicative of a process space explored in accordance with the present invention.

FIG. 4 is an exemplary graphical map 400 of a portion of a process space. In one embodiment, the graphical map 400 can include a matrix-like array of identifiers 410, which are representative of or correspond to one or more process windows having a given combination of two or more lithography process parameters. Such a graphical map can be generated or otherwise provided to illustrate the classification or evaluation of the edges of structures within a plurality of simulation images for a given process space. Alternatively, the graphical map can illustrate the classification or evaluation of other features or attributes of structures within the plurality of simulation images.

As described above, the edges of structures within the various simulation images can be classified by performing one or more ORC checks. Based on the results of each of the one or more ORC checks, the identifiers 410 can be darkened or otherwise altered to indicate poor or unacceptable manufacturability as well as good or acceptable manufacturability. For example, the graphical map 400 includes a plurality of identifiers, which can be indicative of the results of at least three different ORC checks (e.g., checks based on maximum intensity, minimum intensity, and minimum slope of edge intensity). After the first ORC check (e.g., maximum intensity) is performed on the plurality simulation images having the combination of lithography process parameters illustrated in the process space, any identifiers representing or corresponding to a process space failing the first ORC check can be darkened or otherwise identified. These are designated by reference numeral 420 in FIG. 4. Similarly, a second ORC check (e.g., minimum intensity) can be performed on the plurality of simulation images and identifiers representing or corresponding to a process space failing the second ORC check can be darkened or otherwise identified. These are designated by reference numeral 430 in FIG. 4. Finally, a third ORC check (e.g., minimum slope of edge intensity) can be performed on the plurality of simulation images and identifiers representing or corresponding to a process space failing the third ORC check can be darkened or otherwise identified. These are designated by reference numeral 440 in FIG. 7. It is to be appreciated that the darkening or otherwise identifying can be different depending upon which ORC check is failed. Once all of the desired ORC checks are performed, the remaining undarkened identifiers can be thought of as indicating a process space 450 that is acceptable from a manufacturing point of view for the given layout or target database for a given range of focus, exposure and/or reticle variations. Conversely, the darkened or otherwise identified identifiers can be thought of as indicating a process space that is unacceptable from a manufacturing point of view for the given layout or target database for a given range of focus, exposure and/or reticle variations.

It is to be appreciated that the methodology described above involves an evaluation of RET strategies or combinations of lithography process parameters for a given layout or target database using process-calibrated ORC checks (i.e., checks in which variations in focus, exposure and/or the reticle are held within a fixed range). However, as is described more fully below, there is room for iteration between evaluating optimal RET strategies and evaluating or otherwise creating design rules in order to maximize manufacturability as well as minimize chip size.

For example, referring again to FIG. 3, if the simulation of the desired layout or target database (step 310) and the ORC described above (step 320) identify regions, areas and/or features (e.g., structure edges) exhibiting poor manufacturability one or more new design rules can be created. Alternatively, existing design rules can be modified. Such design rules can be created or otherwise modified to disallow regions, areas, and/or features of a layout exhibiting poor manufacturability. For example, a general predetermined design rule may require certain spacing between adjacent structures or a certain relationship between layers within a layout (e.g., a polysilicon layer and an active layer). However, through the methodology described herein, it may be determined that the aforementioned general design rule only provides a structure with acceptable manufacturability when adjacent structures having certain dimensions and/or properties are present. In such a case, a new design rule can be created to prohibit situations in which the arrangement of structures or layers provides a layout exhibiting poor manufacturability. Alternatively, the general design rule may be modified or otherwise made more specific to disallow layouts or portions thereof demonstrating poor manufacturability. It is to be appreciated that this methodology may be performed iteratively until a layout demonstrating enhanced and/or improved manufacturability is produced.

Once one or more new design rules are created and/or existing design rules are modified, a layout, which is compliant with all new design rules, can be produced. At this point, the new layout can be simulated for a plurality of RET strategies (step 310) and the optical rule checking can be performed (step 320) as described above.

For additional discussion of using simulation tools to create and/or modify design rules, attention is directed to co-owned U.S. patent application Ser. No. 10/817,132, filed Apr. 2, 2004, titled "SYSTEM AND METHOD FOR DESIGN RULE CREATION AND SELECTION," which is now assigned U.S. Pat. No. 7,194,725, the disclosure of which is incorporated herein by reference in its entirety.

Although particular embodiments of the invention have been described in detail, it is understood that the invention is not limited correspondingly in scope, but includes all changes, modifications and equivalents.

What is claimed is:

1. In a photolithography processing system having an associated numerical aperture (NA) value in which a reticle having a set of reticle parameters is exposed to an illuminator having a set of illuminator parameters to pattern a wafer with a desired layout, a method for manufacturing an integrated circuit device comprising the steps of:
   simulating how the desired layout will pattern on a wafer for a plurality of combinations of different NA values, illuminator parameters and reticle parameters;
   for each combination of NA values, illuminator parameters and reticle parameters, classifying structures within the associated simulated layouts based on manufacturability; and
   selecting at least one combination of NA value, illuminator parameters and reticle parameters based on the classifying step.

2. The method of claim 1, wherein the illuminator parameters include at least one of (i) illuminator source shape, (ii) number of poles, (iii) orientation of poles, (iv) inner radius, (v) outer radius, and (vi) wedge angle.

3. The method of claim 1, wherein the simulating step is performed automatically using the same simulation engine as is used for performing optical proximity correction (OPC) and mask data preparation.

4. The method of claim 1, wherein the simulating step includes simulating variations over a predetermined range in at least one of focus, exposure and a mask.

5. The method of claim 1, said method further comprising:
   based on the simulating step, providing a graphical representation indicating the manufacturability of the layout for a plurality of resolution enhancement techniques (RETs).

6. The method of claim 5, wherein each RET includes a combination of illuminator parameters, numerical aperture (NA) and mask parameters.

7. The method of claim 6, wherein the mask parameters include at least one of mask type and mask transmission.

8. The method of claim 1, wherein the simulating step includes simulating and performing optical proximity correction (OPC) on the layout.

9. The method of claim 8, wherein simulating how structures within the layout will pattern for a plurality of resolution enhancement techniques (RETs) is performed using the same simulation engine as is used to perform OPC on the layout.

10. The method of claim 9, wherein the simulating step is automated with respect to performing OPC on the layout.

11. In a photolithography processing system having an associated numerical aperture (NA) value in which a reticle having a set of reticle parameters is exposed to an illuminator having a set of illuminator parameters to pattern a wafer with a desired layout, a method for manufacturing an integrated circuit device comprising the steps of:
   simulating how the desired layout will pattern on a wafer for a plurality of combinations of different NA values, illuminator parameters and reticle parameters;
   for each combination of NA values, illuminator parameters and reticle parameters, classifying structures within the associated simulated layouts based on manufacturability; and
   selecting at least one combination of NA value, illuminator parameters and reticle parameters based on the classifying step;
   wherein the classifying step includes:
      performing optical rule checking (ORC) on structures within each simulation; and for each simulation, calculating a percentage of optically different edges that demonstrate acceptable manufacturability.

12. The method of claim 11, wherein performing ORC includes checking structures within the simulations based on one of aerial image metrics, resist image metrics, and post exposure bake metrics.

13. The method of claim 12, wherein the aerial image metrics include at least one of image edge slope, image edge log slope, contrast, minimum intensity, maximum intensity, edge placement error and intensity at a given distance.

14. The method of claim 13, said method further comprising:

recording values for at least one of the aerial image metrics, resist image metrics, and post exposure bake metrics in a searchable data table structure.

15. The method of claim 11, wherein the selecting step includes:

selecting resolution enhancement techniques (RETs) that correspond to simulations having a percentage of acceptable optically different edges that is greater than a predefined value.

* * * * *